United States Patent [19]

Krause

[11] Patent Number: 4,680,550

[45] Date of Patent: Jul. 14, 1987

[54] HIGH-FREQUENCY ANTENNA DEVICE IN APPARATUS FOR NUCLEAR SPIN TOMOGRAPHY AND METHOD FOR OPERATING THIS DEVICE

[75] Inventor: Norbert Krause, Heroldsbach, Fed. Rep. of Germany

[73] Assignee: Siemens Aktiengesellschaft, Munich, Fed. Rep. of Germany

[21] Appl. No.: 713,635

[22] Filed: Mar. 19, 1985

[30] Foreign Application Priority Data

Mar. 20, 1984 [DE] Fed. Rep. of Germany ....... 3410204

[51] Int. Cl.$^4$ ........................................... G01B 33/20
[52] U.S. Cl. ................................................. 324/318
[58] Field of Search ......................... 324/309, 318-320

[56] References Cited

U.S. PATENT DOCUMENTS 4,506,224 3/1985 Krause ........................... 324/320 X

FOREIGN PATENT DOCUMENTS 3133432 3/1983 Fed. Rep. of Germany .

OTHER PUBLICATIONS

"Research Papers", Resolution and Signal-to-Noise Relationships in NMR Imaging in the Human Body, *J. Phys. E: Sci. Instrum.*, vol. 13, 1980, printed in Great Britain, J. M. Libove and J. R. Singer, May 2, 1979, pp. 38-44.

D. Homogene Wellenleiter, Insbesondere Hohlleiter, *Taschenbuch der Hochfrequenztechnik*, H. Meinke and F. W. Gundlach, 1968, pp. 308-317, 332-339, and 462-465.

*Primary Examiner*—Michael J. Tokar
*Assistant Examiner*—Francis J. Jaworski
*Attorney, Agent, or Firm*—Kenyon & Kenyon

[57] ABSTRACT

An antenna device for coupling to a magnetic high-frequency field in apparatus for nuclear spin tomography, includes at least two conductor sections of predetermined length which extend on an imaginary cylinder surface parallel to the direction of the axis of the imaginary cylinder and are arranged for current flow in opposite directions when one end of each of the sections is connected to an external device, a tubular enclosure arranged at a predetermined distance concentrically with respect to the imaginary cylinder surface surrounding the conductor sections, the enclosure being at least largely permeable to low frequencies for magnetic gradient fields, containing electrically highly conductive material and adapted to be connected to the external device, the tubular enclosure extending in the axial direction beyond the end of the conductor sections by a predetermined amount so as to form a circular waveguide antenna with a periodic wave propagation, the coupling elements of which are the conductor sections, and reflectors terminating the other ends of the conductors to reflect waves of the high-frequency field so that a high-frequency field oscillating in phase is formed by the tubular enclosure and the conductor sections.

20 Claims, 4 Drawing Figures

HIGH-FREQUENCY ANTENNA DEVICE IN APPARATUS FOR NUCLEAR SPIN TOMOGRAPHY AND METHOD FOR OPERATING THIS DEVICE

BACKGROUND OF THE INVENTION

This invention relates to nuclear spin tomography in general and more particularly to an antenna device for exciting an at least largely homogeneous magnetic high-frequency field and/or for receiving corresponding high-frequency signals in a nuclear spin tomography apparatus.

An antenna device for exciting an at least largely homogeneous magnetic high-frequency field and/or for receiving corresponding high-frequency signals in apparatus for nuclear spin tomography, in which device at least two conductor sections of predetermined length are provided which extend on an imaginary cylinder surface parallel to the direction of the cylinder axis, through which current flows in opposite directions and which are connected to an external energy feeding device is disclosed in DE-OS No. 3133432. The antenna device further contains a tubular enclosure which is arranged at a predetermined distance concentrically with respect to the imagined cylinder surface and around the conductor sections. The enclosure passes at least largely, low-frequency magnetic gradient fields, contains electrically highly conducting material and is likewise connected to the energy feeding or receiving device. The conductor sections are terminated at their respective end which is not connected to the energy feed or receiving device by means reflecting the waves of the high-frequency field so that a high-frequency field which oscillates in phase can be developed by the conductor system formed by the tubular enclosure and the conductor sections.

In the field of medical diagnostics image-forming methods have been developed in which resonance signals integrated by calculation or measurement of nuclei of a given element of, in particular, a human body or part of a body are analyzed. From the spatial spin density and/or relaxation time distribution so obtained, an image similar to an x-ray tomogram can be constructed. Such methods are known under the designation "Nuclear Spin Tomography" (Nuclear Magnetic resonance tomography) or "Zeugmatography."

A requirement in nuclear spin tomography is a strong magnetic field which is generated by a so-called base field magnet, is as homogeneous as possible in a region of predetermined extent and into which the body to be examined is placed along an axis which generally coincides with the orientation axis of the magnetic base field. Superimposed on this base field are stationary and/or pulsed, so-called gradient fields. For exciting the individual atomic nuclei in the body to perform a precession motion, a special antenna device is further required, by which means of a high-frequency magnetic alternating field (RF alternating field) can be excited for a short time and which can also be used for receiving the RF signals connected thereto if a separate measuring coil is not provided for this purpose.

As is well known, the quality of the sectional images in such apparatus for nuclear spin tomography (NMR tomography) depends on the signal-to-noise ratio of the induced nuclear spin resonance signal. Since this signal-to-noise ratio in turn depends on the strength of the magnetic base field and increases with frequency, it is desirable to provide frequencies as high as possible for high base fields (see "Jour. Phys. E: Sci. Instrum.", volume 13, 1980 pages 38 to 44).

With the known RF antenna device mentioned above, RF fields with high frequencies of about 20 MHz or more can be excited and received. To this end, the antenna device contains a tubular antenna part of electrically highly conductive nonmagnetic material. This antenna part represents and envelope around several conductor sections which form at least one pair of conductors which are disposed on an imaginary cylinder surface, around which the envelope is arranged concentrically at predetermined spacings. On the at least one conductor pair and the envelope and wave propagation with very high frequency is then made possible, resonance conditions being adjusted in such a manner that fields oscillating in the same phase are developed in the entire volume of interest in the form of standing waves on the pair of conductors. Since, furthermore, the common envelope around the pair of conductors is designed so that it passes, at least largely, low frequencies, the low-frequency gradient fields can accordingly propagate unimpeded in the volume into which the body to be examined is to be placed.

In this known antenna device, however, the alternating RF field can also cover regions which are located in front of the respective axial end faces of the conductor system formed by the conductor sections and the tubular enclosure. This means that disturbances caused in these regions can possibly falsify the high-frequency measuring signal.

It is, therefore, an object of the present invention to improve this known antenna device in such a manner that it is largely independent of external interference fields.

SUMMARY OF THE INVENTION

According to the present invention, this problem is solved by extending the tubular enclosure in the axial direction beyond the ends of the conductor sections at the end face by a predetermined amount, so that a circular waveguide antenna with aperiodic wave propagation is developed by it, the coupling elements of which are the conductor sections.

In this antenna device, high-frequency power is coupled in the tubular enclosure via conductor sections which are located in the region of the axial center of the tubular envelope serving as the circular waveguide, where an aperiodic wave propagation is set due to the predetermined dimensions of the tubular enclosure (see, for instance, H. Meinke/F. W. Grundlach: Taschenbuch der Hochfrequenztechnik, 3. Edition, 1968, pages 309 to 316). Since the diameter of the tubular enclosure is always small relative to the wavelength of the high-frequency field of 20 MHz or higher, this circular waveguide antenna can be operated in a so-called "cut-off" region below a given critical frequency, in that the propagation of the high-frequency field is limited practically completely to the space enclosed by the tubular enclosure. The advantages connected with this embodiment of the antenna device are then seen in the fact that in this manner an interaction of the high-frequency field with external interference fields can be prevented at least to a high degree.

According to a further embodiment of the antenna device of the present invention, an additional coupling system may be provided advantageously in at least two parallel cross-sectional planes which are symmetrical to the central cross-sectional plane through the tubular enclosure serving as the circular waveguide antenna. Such an antenna device is advantageously operated in such a manner that the phase conditions and the amplitude conditions at the additional coupling systems are set, by means of the energy feeding device connected to them, in such a manner that the field strengths caused by the coupling system formed by the conductor sections and by the additional coupling systems alone are superimposed to form an overall field strength which is practically zero outside the region bounded by the parallel cross-sectional planes of the two additional coupling systems.

DETAILED DESCRIPTION

The high-frequency antenna device according to the present invention is to be provided for apparatus in nuclear spin tomography known per se. Such apparatus comprises in general at least one normal or, in particular, superconducting field coil system which is arranged concentrically with respect to the z-axis of an x-y-z coordinate system and with which a strong base field as homogeneous as possible is produced. In addition, gradient coils for generating sufficiently constant magnetic field gradients are provided. The magnet coils permit axial access to the homogeneous field region at their center, i.e., in particular, a human body or body part to be examined is placed in the magnetic field along the z axis. The nuclear spin is excited by means of an RF field as homogeneous as possible which is oriented perpendicular to the z axis.

Figure 1:
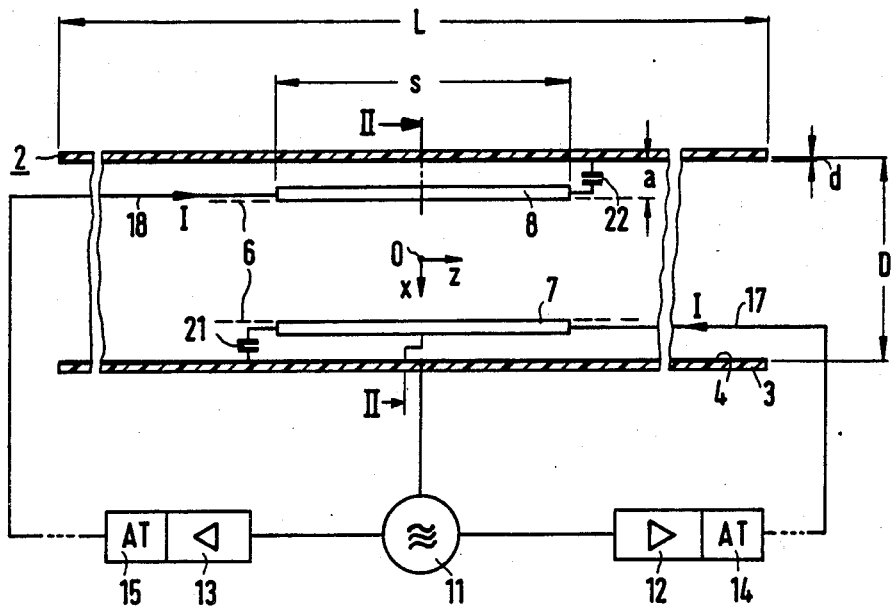
FIG. 1 is a longitudinal section of a high-frequency antenna device according to the present invention indicated schematically.
Figure 2:
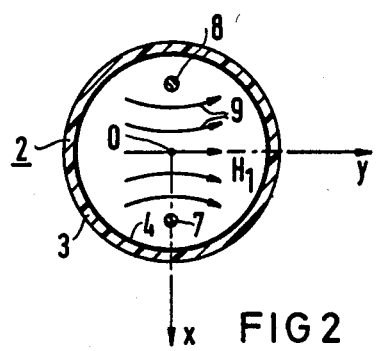
FIG. 2 is a transverse cross-section of the antenna of FIG. 1.

An embodiment of a high-frequency antenna device according to the present invention which can be used for this purpose, is shown in FIG. 1 as a longitudinal section and in FIG. 2 as a cross section. In the Figures, like parts are provided with the same reference symbols. The antenna device, in which the device shown in DE-OS No. 31 33 432 is taken as the basis, contains a hollow cylindrical tubular enclosure 2, the cylinder axis of which points in the direction of the z axis of an orthonogal x-y-z coordinate system. The coordinate origin O is placed in the axial center of the tubular envelope. This tubular enclosure with an axial length L and a diameter D consists of an electrically highly conductive nonmagnetic material such as copper and may optionally be silverplated at least on one side. The tubular enclosure 2 is formed, for instance, by a nonmetallic, electrically insulated tubular carrier 3, to the inside of which a thin copper foil or film is applied. According to the illustrated embodiment assumed in FIGS. 1 and 2, the tubular enclosure itself is therefore formed by this copper foil 4. Optionally, the copper foil can also be arranged on the outside of a corresponding carrier tube. Since the tubular enclosure should be sufficiently permeable for the low-frequency gradient fields, the wall thickness d of its electrically conductive material must, on the one hand, be relatively small. On the other hand, the RF resistance of the tubular envelope increases with decreasing thickness, for which reason the thickness d should advantageously be chosen larger than the depth of penetration of the high-frequency field. In general, the thickness d to be provided is between 10 and 50 $\mu$m.

The tubular enclosure 2 encloses several electric conductors lying on at least one imaginary cylinder surface. The distance a between the tubular enclosure 2 and the cylinder surface which is indicated by a dotted line 6 and is arranged concentrically therewith, has a predetermined value a. At least two conductor sections 7 and 8 can be provided which form a conductor pair, have an axial length s and through which a current I flows. Advantageously, a respectively predetermined number of parallel-connected conductor sections is used which lie side-by-side with spacing on the cylinder surface 6 (see the cited DE-OS No. 31 33 432).

With this system formed by the tubular enclosure 2 and the conductor sections 7 and 8, a high-frequency magnetic field $H_1$ is generated (FIG. 2) which is indicated by lines 9 with arrows and is largely homogeneous, at least about the central examination region around the coordinate origin O and is oriented perpendicularly to the z axis. For this purpose, a high-frequency current is fed from an energy feeding device, which is only indicated in FIG. 1, and comprises a generator 11, amplifiers 12 and 13 as well as matching tranformers 14 and 15, into the conductor sections 7 and 8 as well as into the tubular enclosure 2 in such a manner that standing waves are formed in this system of conductor sections and the tubular envelope, the operation being at resonance. As is indicated by the current arrows at the leads 17 and 18 leading to the conductor sections 7 and 8, the current I in the diametrically opposite conductor sections 7 and 8 is to flow in opposite directions. In the antenna volume of interest, high frequency fields oscillating in phase are thus generated. In order to limit the length s of the conductor sections 7 and 8 required for resonance operation, capacitances 21 and 22 with predetermined values are provided in a manner known per se, for instance, at their ends, between the tubular enclosure 2 and the conductor sections 7 and 8 (see the cited DE-OS No. 31 33 432).

In order to shield the system formed by the conductor sections 7 and 8 and the tubular enclosure 2 surrounding them against interfering radiation from the end face, the length L of the tubular enclosure 2 is at least twice as large as the length s of the conductor sections. The tubular enclosure 2 and the conductor sections 7 and 8 extend symmetrically to the cross-sectional plane (z=0) extending through the coordinate origin O. For, with these measures and due to the fact that the diameter D of the tubular enclosure 2 is small relative to the wavelength of the RF field, the tubular enclosure 2 will act like a circular waveguide antenna which is operated below a given critical frequency in a so-called "cutoff" range mode. The conductor sections 7 and 8 then represent, in the region of the cross-sectional plane extending through the center of its axial dimension, a system of coupling elements for coupling in and out the corresponding high-frequency power. If, therefore, high-frequency power is fed in the plane z=0 of the tubular envelope extending from z=−L/2 to z=+L/2, the magnetic RF field drops off toward positive and negative z according to a function $\exp(-\alpha|z|)$ (see the mentioned Handbook, page 309) Alpha is a frequency-dependent numerical value typical in the tubular enclosure for the state of the field, the so-called mode. Particularly advantageous for application in nuclear spin tomography is operation in the so-called $H_{11}$ mode with a magnetic field $H_1$ transverse to the z axis, as can also be seen in FIG. 2 (see, for instance, the cited Handbook, pages 332 to 334).

Figure 3:
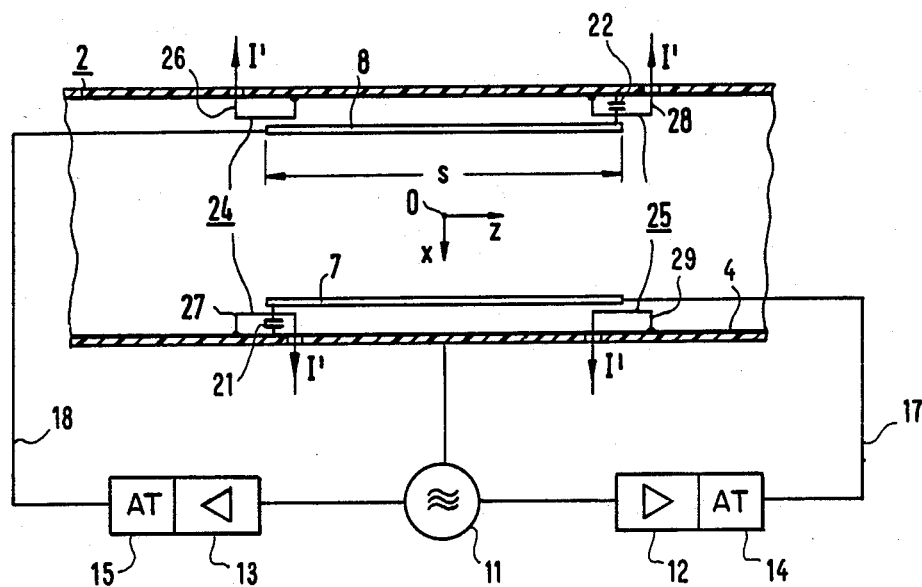
FIG. 3 is a longitudinal cross-section of a further embodiment of an antenna device according to the present invention indicated schematically.

According to the embodiment of FIGS. 1 and 2, it was assumed that an excitation of the tubular enclosure 2 acting as a circular waveguide antenna takes place only in the transverse center plane (z=0) via a corresponding coupling system formed by the individual conductor sections. However, it is particularly advantageous if the excitation takes place in several transversal planes, where further coupling systems are provided in tranversal planes lying symmetrically to the transversal center plane (z=0). Thus, the excitation may take place particularly in three transversal planes. Such an excitation system is schematically illustrated in FIG. 3 in a longitudinal section through the antenna device according to the present invention. Parts coinciding with FIG. 1 are provided with the same reference symbols.

The antenna device according to the present invention shown in FIG. 3 contains, besides the at least one pair of conductor sections 7 and 8, in the region of the cross-sectional planes terminating the two end faces of these conductor sections (z=−s/2 and z=+s/2), respective coupling systems 24 and 25 of at least one pair of coupling elements 26 and 27 and 28 and 29. These coupling elements which are arranged diametrically within a system are inductive coupling elements known per se (see, for instance, the mentioned Handbook, pages 462 to 465 and particularly FIG. 4.4). These coupling elements have the shape of brackets on the inside of the tubular enclosure 2, extend in the z direction and are connected on one side to the electrically conducting wall, of, for instance, the copper foil 4. Their respective other ends are brought through the tubular enclosure 2 insulated and are connected via coaxial cables to an external energy feeding device, not shown. The connections of the respective coupling elements and thus, also the feedthroughs through the tubular enclosure are arranged so that the flow directions of the currents I' indicated by arrows at the connecting cables in opposite coupling elements are opposite to each other as seen in the z direction.

According to the embodiment shown in FIG. 3, the coupling systems 24 and 25 each comprise only two coupling elements 26 and 27 and 28 and 29, respectively. Optionally, however, each individual coupling element can also be replaced by several coupling elements through which current flows in the same direction, so that then, a corresponding number of pairs of diametrically arranged coupling elements is formed which carry current in opposite directions (see the cited DE-OS No. 31 33 432).

Figure 4:
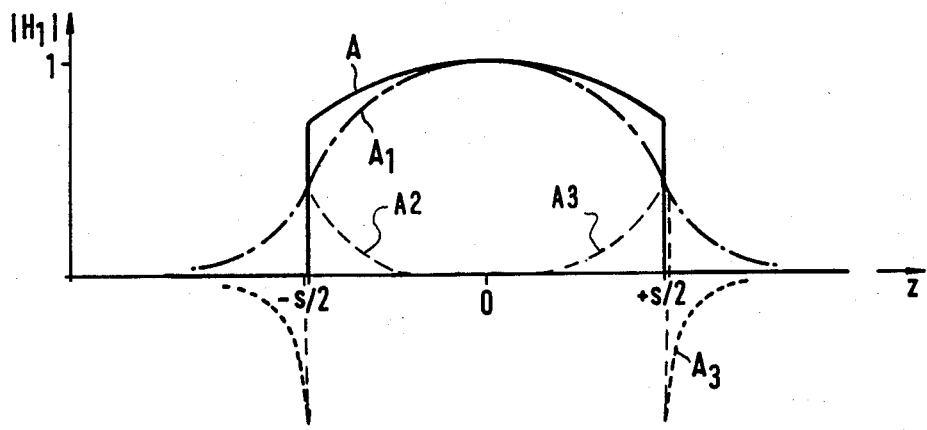
FIG. 4 is a diagram illustrating the field strength conditions which can be developed with the antenna of FIG. 3.

The field strength conditions to be developed in the antenna device according to FIG. 3 can be seen in detail from the diagram shown in FIG. 4. The field strength which is developed at the coordinate origin 0 and is pointing in the x direction is to have a normalized magnitude $H_1=1$. In this diagram, the magnitude of this relative field strength $|H_1|$ is given in the longitudinal direction of the tubular envelope as a function of the position on the z axis. Beside the central coupling system formed by the conductor sections 7 and 8 extending from z=−s/2 to z=+s/2, the two coupling systems 24 and 25 are arranged at z=−s/2 and z=+s/2. The field pattern obtained in the tubular enclosure without the use of the additional coupling systems is illustrated by a dashdotted curve $A_1$. This field pattern is also obtained for the antenna device according to FIGS. 1 and 2. If, however, an additional field is fed into the individual additional coupling systems 24 and 25 in the regions z=−s/2 and z=+s/2, respectively, with a defined phase and amplitude difference according to the dotted curve $A_2$ and $A_3$, respectively, a very steep drop of the field to practically zero can advantageously be obtained in the mentioned z regions. The corresponding field pattern shown by a solid curve A is, therefore, obtained from a superpositioning of the field shapes $A_1$, $A_2$ and $A_3$ generated by the conductor sections 7 and 8 and the additional coupling systems 24 and 25. The field $H_1$ is, therefore, practically zero for all z values with $|z|$ larger than s/2. This means that the field is limited to a transversal region of length s. In this manner, in particular noise pickup from parts of the body to be examined contained in the measurement volume can be advantageously eliminated.

According to the embodiment shown in FIG. 3 of an antenna device according to the present invention, it was assumed that the coupling elements 26 to 29 of the additional coupling system 24 and 25 are in the same longitudinal sectional plane through the tubular enclosure 2 as the conductor sections 7 and 8. Optionally, however, the coupling elements can also be arranged in longitudinal section planes which subtend a predetermined angle with the longitudinal section plane containing the conductor sections.

What is claimed is:

1. An antenna device for generating a high-frequency magnetic field in an apparatus for nuclear spin tomography, comprising:
    (a) an energy source;
    (b) at least two conductor sections of predetermined length which extend on an imaginary cylinder surface parallel to the direction of the axis of the imaginary cylinder and are arranged for current flow in opposite directions when one end of each of said sections is connected to said energy source;
    (c) a tubular enclosure arranged at a predetermined distance concentrically with respect to the imaginary cylinder surface, surrounding the conductor sections, said enclosure being at least largely permeable to low frequencies for magnetic gradient fields, containing electrically highly conductive material and connected to said energy source, said tubular enclosure extending in the axial direction beyond the end of the conductor sections by a predetermined amount to form a circular waveguide antenna with aperiodic wave propagation in a cut-off mode at the axial ends of said enclosure, the coupling elements of which are said conductor sections; and
    (d) means for reflecting the waves of the high-frequency field terminating the other ends of said conductors so that a high-frequency field oscillating in phase is formed by the tubular enclosure and the conductor sections which field is attenuated axially beyond said conductor sections.

2. An antenna device according to claim 1, wherein the axial length of said tubular enclosure forming a circular waveguide antenna is at least twice as large as the corresponding length of the conductor sections.

3. An antenna device according to claim 1, wherein said individual conductor sections are arranged symmetrically with respect to the axial center of said tubular enclosure serving as the circular waveguide antenna.

4. An antenna device according to claim 1, wherein said tubular enclosure forming a circular waveguide antenna comprises a foil or film of electrically highly conductive material which is applied to the inside or outside of a carrier body consisting of electrically insulating material.

5. An antenna device according to claim 4, wherein the thickness of said part of the tubular enclosure which forms the circular waveguide antenna consists of electrically conductive material is between 10 and 50 μm.

6. An antenna device according to claim 5, and further including a further system of coupling elements disposed at at least two parallel cross-sectional planes which are symmetrical to the central cross-sectional plane passing through said tubular enclosure forming a circular waveguide antenna.

7. An antenna device according to claim 1, wherein the thickness of the part of said tubular enclosure which forms the circular waveguide antenna consisting of electrically conductive material is between 10 and 50 μm.

8. An antenna device according to claim 1, and further including a further system of coupling elements disposed at at least two parallel cross-sectional planes which are symmetrical to the central cross-sectional plane passing through said tubular enclosure forming a circular waveguide antenna to further attenuate the magnetic field in the axial direction beyond said conductor sections.

9. An antenna device according to claim 8, wherein said further system of coupling elements is disposed in the region of the end faces of the conductor sections.

10. An antenna device according to claim 9, wherein the coupling elements are bracket-shaped and have axially extending conductor sections which are connected on one side to the electrically conductive material of said tubular enclosure forming a circular waveguide antenna in an electrically conducting manner.

11. An antenna device according to claim 10, wherein in said further system the flow directions of the currents are opposed to each other in the axially extending conductor sections of the corresponding coupling elements.

12. An antenna device according to claim 9, wherein each further coupling system comprises at least one pair of diametrically opposite coupling elements which are arranged on the inside of said tubular enclosure forming a circular waveguide antenna.

13. An antenna device according to claim 12, wherein the coupling elements are bracket-shaped and have axially extending conductor sections which are connected on one side to the electrically conductive material of said tubular enclosure forming a circular waveguide antenna in an electrically conducting manner.

14. An antenna device according to claim 13, wherein in said further system the flow directions of the currents are opposed to each other in the axially extending conductor sections of the corresponding coupling elements.

15. An antenna device according to claim 8, wherein each further coupling system comprises at least one pair of diametrically opposite coupling elements which are arranged on the inside of said tubular enclosure forming a circular waveguide antenna.

16. An antenna device according to claim 15, wherein the coupling elements are bracket-shaped and have axially extending conductor sections which are connected on one side to the electrically conductive material of said tubular enclosure forming a circular waveguide antenna in an electrically conducting manner.

17. An antenna device according to claim 16, wherein in said further system the flow directions of the currents are opposed to each other in the axially extending conductor sections of the corresponding coupling elements.

18. An antenna device according to claim 8, wherein the coupling elements are bracket-shaped and have axially extending conductor sections which are connected on one side to the electrically conductive material of said tubular enclosure forming a circular waveguide antenna in an electrically conducting manner.

19. An antenna device according to claim 18, wherein in said further system the flow directions of the currents are opposed to each other in the axially extending conductor sections of the corresponding coupling elements.

20. A method of operating an antenna device which antenna comprises:

(a) at least two conductor sections of predetermined length which extend on an imaginary cylinder surface parallel to the direction of the axis of the imaginary cylinder and are arranged for current flow in opposite directions when one end of each of said sections is connected to an external current source;

(b) a tubular enclosure arranged at a predetermined distance concentrically with respect to the imaginary cylinder surface, surrounding the conductor sections, said enclosure being at least largely permeable to low frequencies for magnetic gradient fields, containing electrically highly conductive material and connected to said current source, said tubular enclosure extending in the axial direction beyond the end of the conductor sections by a predetermined amount so as to form a circular waveguide antenna with a periodic wave propogation and operating in a cut-off mode at the axial ends of said enclosures, the coupling elements of which are said conductor sections;

(c) means for reflecting the waves of the high-frequency field terminating the other ends of said conductors so that a high-frequency field oscillating in phase is formed by the tubular enclosure and the conductor sections; and (d) a further system of coupling elements disposed at at least two parallel cross-sectional planes which are symmetrical to the central cross-sectional plane passing through said tubular enclosure forming a circular waveguid antenna, said method comprising the steps of:

adjusting the phase and amplitude conditions at the additional coupling systems by means of an energy feeding device connected thereto in such a manner that the field strengths caused by these coupling systems together with the field strength by the conductor sections alone are superimposed to form a total field strength which is practically zero outside of the region bounded by the parallel cross-sectional planes of the two additional coupling systems.

* * * * *